United States Patent
Liu

(10) Patent No.: US 9,985,243 B2
(45) Date of Patent: May 29, 2018

(54) ENCAPSULATION METHOD OF AN OLED AND OLED DEVICE

(71) Applicant: BOE TECHNOLOGY GROUP CO., LTD., Beijing (CN)

(72) Inventor: Deming Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 16 days.

(21) Appl. No.: 15/113,596

(22) PCT Filed: Oct. 23, 2015

(86) PCT No.: PCT/CN2015/092684
§ 371 (c)(1),
(2) Date: Jul. 22, 2016

(87) PCT Pub. No.: WO2017/000440
PCT Pub. Date: Jan. 5, 2017

(65) Prior Publication Data
US 2017/0149009 A1 May 25, 2017

(30) Foreign Application Priority Data

Jun. 30, 2015 (CN) .......................... 2015 1 0386986

(51) Int. Cl.
*H01L 51/52* (2006.01)
*H01L 51/56* (2006.01)

(52) U.S. Cl.
CPC ........ *H01L 51/525* (2013.01); *H01L 51/5246* (2013.01); *H01L 51/5253* (2013.01);
(Continued)

(58) Field of Classification Search
CPC ............... H01L 51/525; H01L 51/5246; H01L 51/5253; H01L 51/56; H01L 51/52; H01L 2251/301; H01L 2251/558
See application file for complete search history.

(56) References Cited

U.S. PATENT DOCUMENTS

| | | | |
|---|---|---|---|
| 2010/0258346 A1 | 10/2010 | Chen et al. | |
| 2014/0061612 A1* | 3/2014 | Yamazaki | H01L 51/5243 257/40 |
| 2015/0228923 A1* | 8/2015 | Schicktanz | H01L 51/5246 257/40 |

FOREIGN PATENT DOCUMENTS

| CN | 1799116 A | 7/2006 |
|---|---|---|
| CN | 101517771 A | 8/2009 |

(Continued)

OTHER PUBLICATIONS

Second Chinese Office Action dated Mar. 23, 2017.
(Continued)

*Primary Examiner* — Thanh T Nguyen
(74) *Attorney, Agent, or Firm* — Dilworth & Barrese, LLP.; Michael J. Musella, Esq.

(57) ABSTRACT

An encapsulation method of an OLED and an OLED device are provided, and the method includes: providing a substrate for encapsulation (401) and a cover plate (403); forming a conductive frame (402) on the substrate for encapsulation (401); cell assembling the substrate for encapsulation (401) which is provided with the frame (402) and the cover plate (403) to obtain a preforming device; placing the preforming device into a plating tank, and energizing the frame (402), wherein a metal thin film (404) is formed on a surface of the frame (402) close to the outside edge of the substrate (401). A layer of metal film (404) is plated at the periphery of the frame (402). Because the blocking effect of the compact structure of the metal thin film (404) to water and oxygen is better than that of a sealing frame cement, thus an OLED device made by the encapsulation method has better sealing effect and better performance.

19 Claims, 4 Drawing Sheets

(52) U.S. Cl.
CPC ........ *H01L 51/56* (2013.01); *H01L 2251/301* (2013.01); *H01L 2251/558* (2013.01)

(56) References Cited

FOREIGN PATENT DOCUMENTS

| | | |
|---|---|---|
| CN | 102447077 A | 5/2012 |
| CN | 103383992 A | 11/2013 |
| CN | 103681756 A | 3/2014 |
| CN | 104253149 A | 12/2014 |
| CN | 104916789 A | 9/2015 |
| KR | 20140012347 A | 2/2014 |
| KR | 20150072116 A | 6/2015 |

OTHER PUBLICATIONS

Search Report and Written Opinion dated Apr. 6, 2016 from State Intellectual Property Office of the P.R. China.
Chinese Office Action dated Aug. 10, 2016.
Third Chinese Office Action dated Jul. 12, 2017.

\* cited by examiner

ENCAPSULATION METHOD OF AN OLED AND OLED DEVICE

TECHNICAL FIELD

Embodiments of the present disclosure relate to a encapsulation method of an OLED and an OLED device.

BACKGROUND

As a new generation of display, OLED (Organic Light-Emitting Diode) display has many advantages such as low energy consumption, high contrast ratio and so on. Therefore, the OLED display has attracted more and more manufacturers' attention.

The OLED device mainly depends on the display unit on the substrate to emit light, the existing display unit adopts an organic light emitting material as a raw material. However, the organic light emitting material is sensitive to water/oxygen, the display unit needs to be packaged and protected after the display unit being manufactured. The traditional encapsulation protection is packaged by a UV (Ultraviolet Rays) cement, for example coating the UV cement on the surface of the substrate around the display unit. After coating the UV cement, the substrate and the cover plate are cell assembled, and the substrate and the cover plate are fit together to complete encapsulation through the UV exposure to solidify the UV cement. But the effect of blocking water and oxygen of the UV cement is not good, which makes the performance of the OLED device be affected by water/oxygen.

SUMMARY

Embodiments of the present disclosure provide a encapsulation method of an OLED, and the method comprises: providing a substrate for encapsulation and a cover plate; forming a conductive frame on the substrate for encapsulation; cell assembling the substrate for encapsulation which is provided with the frame and the cover plate to obtain a preforming device; placing the preforming device into a plating tank, and energizing the frame, wherein a metal thin film is formed on a surface of the frame close to the outside edge of the substrate.

Optional, in the method, an insulation frame is formed on the substrate for encapsulation by using an insulation material; the conductive frame is formed at the periphery of the insulation frame by using an insulation material doped with conductive particles.

Optional, in the method, a thickness of the insulation frame is 1 mm, and a thickness of the conductive frame is 1 mm.

Optional, in the method, the insulation material is UV cement.

Optional, in the method, the conductive particles comprise metal particles, metal wires, graphene or carbon nanotubes.

Optional, in the method, a mass percent of the conductive particles in the insulation material doped with conductive particles is from 5% to 20%.

Optional, in the method, a display unit is formed on the substrate for encapsulation, the display unit comprises a display area and a lead wire area, the frame is arranged at the periphery of the display unit, and the method further comprises: fabricating an insulation layer in the lead wire area, wherein the insulation layer is arranged between the conductive frame and the lead wires of the lead wire area.

Optional, in the method, the metal thin film is a thin film of titanium (Ti), manganese (Mn), iron (Fe), tin (Sn), zinc (Zn), chromium (Cr), silver (Ag) or nickel (Ni), or an alloy thin film of at least two kinds of metal of titanium (Ti), manganese (Mn), iron (Fe), tin (Sn), zinc (Zn), chromium (Cr), silver (Ag) and nickel (Ni).

Optional, in the method, a thickness of the metal thin film is from 7 to 50 μm.

Embodiments of the present disclosure further provide an OLED device, the OLED device comprises: a substrate, a frame, a cover plate, and a metal thin film, wherein the frame is clamped between the substrate and the cover plate, the metal thin film is disposed on a surface close to the outside edge of the substrate of the frame.

Optional, in the OLED device, the frame comprises an insulation frame and a conductive frame composed of an insulation material doped with conductive particles, the conductive frame is arranged at the periphery of the insulation frame.

Optional, in the OLED device, a thickness of the insulation frame is 1 mm, and a thickness of the conductive frame is 1 mm.

Optional, in the OLED device, the insulation material is UV cement.

Optional, in the OLED device, the conductive particles comprise metal particles, metal wires, graphene or carbon nanotubes.

Optional, in the OLED device, a mass percent of the conductive particles in the insulation material doped with conductive particles is from 5% to 20%.

Optional, in the OLED device, a display unit is disposed on the substrate for encapsulation, the display unit comprises a display area and a lead wire area, the frame is arranged at the periphery of the display unit, and the OLED device further comprises: an insulation layer disposed in the lead wire area, wherein the insulation layer is arranged between the conductive frame and the lead wires of the lead wire area.

Optional, in the OLED device, the metal thin film is a thin film of titanium (Ti), manganese (Mn), iron (Fe), tin (Sn), zinc (Zn), chromium (Cr), silver (Ag) or nickel (Ni), or an alloy thin film of at least two kinds of metal of titanium (Ti), manganese (Mn), iron (Fe), tin (Sn), zinc (Zn), chromium (Cr), silver (Ag) and nickel (Ni).

Optional, in the OLED device, a thickness of the metal thin film is from 7 to 50 μm.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

FIG. 4b is a sectional schematic diagram on line A-A of the OLED device in FIG. 4a;

FIG. 5b is a sectional schematic diagram on line A-A of the OLED device in FIG. 5a;

FIG. 6b is a sectional schematic diagram on line A-A of the OLED device in FIG. 6a.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
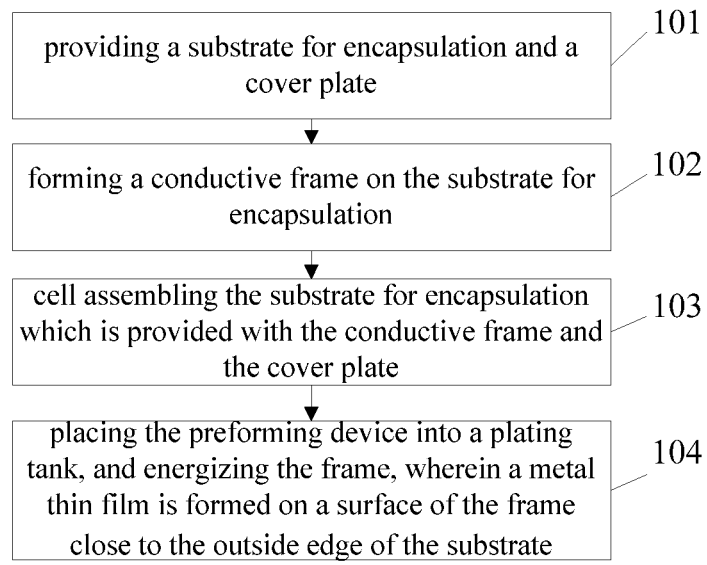
FIG. 1 is a flow diagram of a encapsulation method of an OLED provided by an embodiment of the disclosure.

FIG. 1 provides a flow diagram of an encapsulation method of an OLED according to an embodiment of the present disclosure. Referring to FIG. 1, the method comprises the following steps:

Step 101: providing a substrate for encapsulation and a cover plate.

The substrate for encapsulation is a substrate having an OLED structure, that is a substrate disposed with a display unit. The substrate is a transparent substrate, for example a glass substrate. The display unit generally comprises a display area and a lead wire area.

The cover plate is a transparent cover plate, for example a glass cover plate, and the size and the shape of the cover plate may be consistent with that of the substrate.

Step 102: forming a conductive frame on the substrate for encapsulation.

The frame is generally formed at the periphery of the display unit.

Step 103: cell assembling the substrate for encapsulation which is provided with the frame and the cover plate to obtain a preforming device.

The cell assembled frame is clamped between the substrate for encapsulation and the cover plate.

Step 104: placing the preforming device into a plating tank, and energizing the frame, wherein a metal thin film is formed on a surface of the frame close to the outside edge of the substrate.

Because the frame is electrically conductive, a layer of metal thin film will be plated on the surface of the frame after placing the substrate for encapsulation into a plating tank. Because the blocking effect of the compact structure of the metal thin film to water and oxygen is better than that of a sealing frame cement, thus an OLED device manufactured through the encapsulation method has better sealing effect and better performance.

Figure 2:
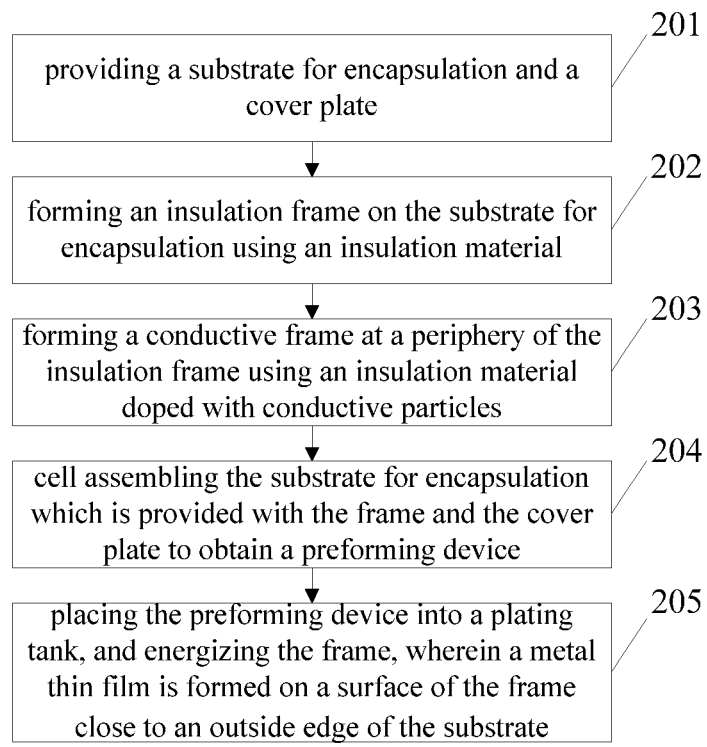
FIG. 2 is a flow diagram of a encapsulation method of an OLED provided by another embodiment of the disclosure.

FIG. 2 provides a flow diagram of an encapsulation method of another OLED according to another embodiment of the present disclosure. Compared with the method provided in FIG. 1, the method provided in FIG. 2 provides a way to form a frame. Referring to FIG. 2, the method comprises the following steps:

Step 201: providing a substrate for encapsulation and a cover plate.

The substrate for encapsulation is a substrate having an OLED structure, which is a substrate disposed with a display unit. The substrate is a transparent substrate, for example a glass substrate. The display unit generally comprises a display area and a lead wire area.

The cover plate is a transparent cover plate, for example a glass cover plate. The size and shape of the cover plate may be consistent with that of the substrate.

Step 202: forming an insulation frame on the substrate for encapsulation using an insulation material.

The insulation frame is generally formed at the periphery of the display unit.

In an embodiment of the present disclosure, for example, the insulation material is UV cement. When the UV cement is used as an insulation material for fabricating the insulation frame, the UV cement only needs to be coated on the array substrate to form a frame shape. The manufacturing process of the insulation frame can be easily implemented employing existing equipments. Of course, the insulation material in the embodiment of the present disclosure is not limited to UV cement, for example, the insulation material may also be an insulation material such as silica.

Step 203: forming a conductive frame at the periphery of the insulation frame by using an insulation material doped with conductive particles.

In an embodiment of the present disclosure, the conductive particles comprise metal particles, metal wires, graphene or carbon nanotubes. Accordingly, the insulation material doped with conductive particles can be UV cement doped with metal particles, metal wires, graphite or carbon nanotubes. The manufacturing method of the conductive frame is similar to that of the insulation frame, it can be implemented employing existing equipments, and detailed descriptions will be omitted herein.

In an embodiment of the present disclosure, a thickness of the insulation frame is 1 mm, and a thickness of the conductive frame is 1 mm. The insulation frame and the conductive frame set according to the above thicknesses not only ensure the sealing effect, but also keep the entire device to be light.

In an embodiment of the present disclosure, a mass percent of the conductive particles in the insulation material doped with conductive particles is from 5% to 20%, for example, 10%. By keeping the mass percent of the conductive particles in the insulation material doped with conductive particles in the above range, the conductive effect of the frame can be ensured, and electroplating can be achieved successfully.

Step 202 and 203 are used in the formation of the frame, wherein the frame is composed of an insulation frame and a conductive frame, the insulation frame is used for insulating the internal display unit and external space, and the conductive frame is used for ensuring the implementation of the electroplating.

Step 204: cell assembling the substrate for encapsulation which is provided with the frame and the cover plate to obtain a preforming device.

Cell assembling the substrate for encapsulation which is provided with the frame and the cover plate can be achieved in the following ways, for example: first, aligning the substrate for encapsulation and the cover plate, then irradiating the frame with UV irradiation, so the substrate and the cover plate are fit together.

The cell assembled frame is clamped between the substrate for encapsulation and the cover plate.

Step 205: placing the preforming device into a plating tank, and energizing the frame, wherein a metal thin film is formed on a surface of the frame close to the outside edge of the substrate.

Electroplating solution is arranged in the electroplating tank, and the preforming device is placed in the electroplating solution. At the same time, the metal material used for electroplating is inserted into the electroplating solution, and then the frame and the metal material are electrified to complete electroplating. For example, the contents of the electroplating solution comprise but not limited to a main salt, a conductive salt, a buffering agent and an additive.

In an embodiment of the present disclosure, the metal thin film for example can be a thin film of titanium (Ti), manganese (Mn), iron (Fe), tin (Sn), zinc (Zn), chromium (Cr), silver (Ag) or nickel (Ni), or an alloy thin film of at least two kinds of metal of titanium (Ti), manganese (Mn), iron (Fe), tin (Sn), zinc (Zn), chromium (Cr), silver (Ag) and nickel (Ni), to ensure the sealing effect of the metal thin film.

In an embodiment of the present disclosure, a thickness of the metal thin film for example may be 7 μm to 50 μm. By setting the metal thin film according to the above thickness, not only the sealing effect is ensured, but also the entire device is light.

In addition, the thickness of the metal film can be determined according to the metal materials actually used. For example, the thickness of the zinc (Zn) thin film can be from 7 to 50 μm, for example it can be set as 20 μm; the thickness of the tin (Sn) and nickel (Ni) thin film can be from 10 μm to 20 μm, for example they may be set to 15 μm.

Figure 3:
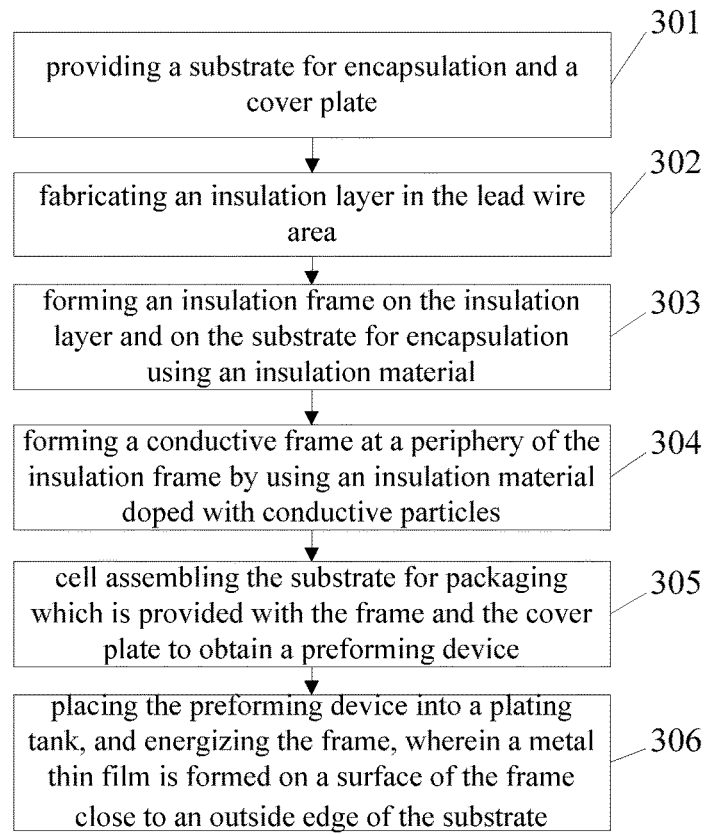
FIG. 3 is a flow diagram of a encapsulation method of an OLED provided by another embodiment of the disclosure.

FIG. 3 provides a flow diagram of an encapsulation method of another OLED provided by another embodiment of the disclosure. Referring to FIG. 3. Compared with the methods provided in FIG. 1 or FIG. 2, the method in FIG. 3 further comprises growing a layer of insulation layer. The method comprises the following steps:

Step 301: providing a substrate for encapsulation and a cover plate, wherein a display unit is formed on the substrate for encapsulation.

The substrate for encapsulation is a substrate having an OLED structure, which is a substrate disposed with a display unit. The substrate is a transparent substrate, for example a glass substrate. The display unit generally comprises a display area and a lead wire area.

The cover plate is a transparent cover plate, for example a glass cover plate. The size and shape of the cover plate may be consistent with that of the substrate.

Step 302: fabricating an insulation layer in the lead wire area.

The shape of the insulation layer can be set in any shape, but it is required to ensure that the lead in the lead wire area can be covered by the insulation layer. The insulation layer is to prevent short circuit generated by the metal thin film disposed on the frame and the lead.

Step 303: forming an insulation frame on the insulation layer and on the substrate for encapsulation using an insulation material.

The insulation frame is generally formed at the periphery of the display unit.

Step 304: forming a conductive frame at the periphery of the insulation frame using an insulation material doped with conductive particles.

The manufacturing method of Step 303 and 304 is similar to that of Step 202 and 203, and detailed descriptions will be omitted herein.

An insulation frame is formed on the insulation layer, and then a conductive frame is formed at the periphery of the insulation frame, and finally, the insulation layer is arranged between the lead wires of the lead wire area and the frame.

Step 305: cell assembling the substrate for encapsulation which is provided with the frame and the cover plate to obtain a preforming device.

The cell assembled frame is clamped between the substrate and the cover plate.

Step 306: placing the preforming device into a plating tank, and energizing the frame, wherein a metal thin film is formed on a surface of the frame close to the outside edge of the substrate.

The manufacturing method of Step 305 and 306 is similar to that of Step 204 and 205, and detailed descriptions will be omitted herein.

Figure 4A:
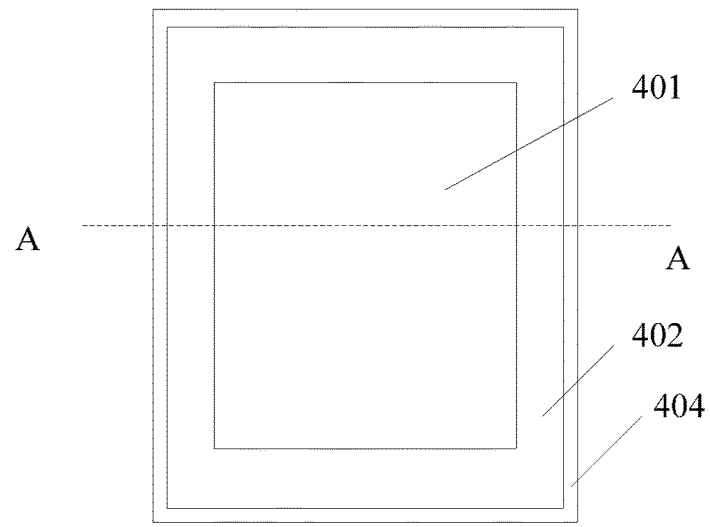
FIG. 4a is a top view structure diagram of an OLED device provided by an embodiment of the disclosure.
Figure 4B:
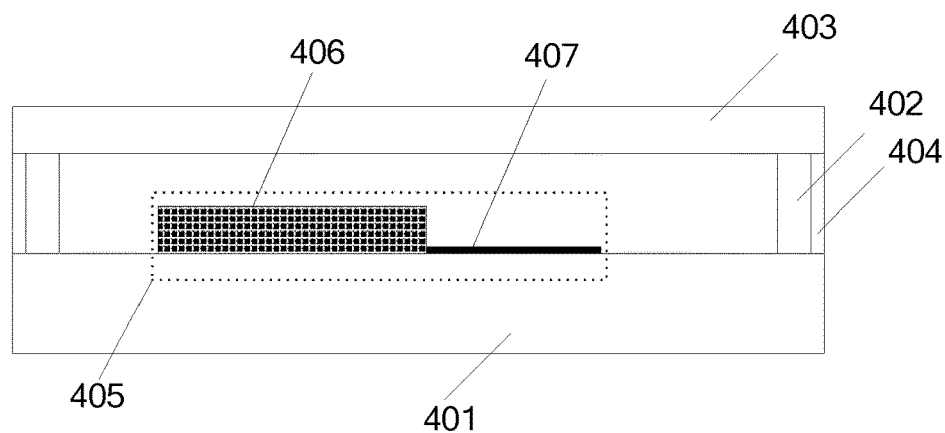

Referring to FIG. 4a and FIG. 4b, an OLED device is provided in another embodiment of the present disclosure. The OLED device comprises: a substrate 401, a frame 402, a cover plate 403, and a metal thin film 404. The frame 402 is clamped between the substrate 401 and the cover plate 403; the metal thin film 404 is disposed on a surface of the frame 402 close to the outside edge of the substrate 401. The frame 402 generally is a barrel structure, the surface of the frame 402 close to the outside edge of the substrate 401 is a surface of the frame 402 exposed outside.

The substrate 401 is a substrate having an OLED structure, which is a substrate disposed with a display unit 405. The substrate 401 is a transparent substrate, for example a glass substrate. The display unit 405 generally comprises a display area 406 and a lead wire area 407. The frame 402 is generally formed at the periphery of the display unit 405.

The cover plate 403 is a transparent cover plate, for example a glass cover plate. The size and shape of the cover plate 403 may be consistent with that of the substrate 401.

A metal thin film 404 is disposed on the surface of the frame 402. Because the blocking effect of the compact structure of the metal thin film 404 to water and oxygen is better than that of a sealing frame cement, thus an OLED device made by the encapsulation method has better sealing effect and better performance.

Figure 5A:
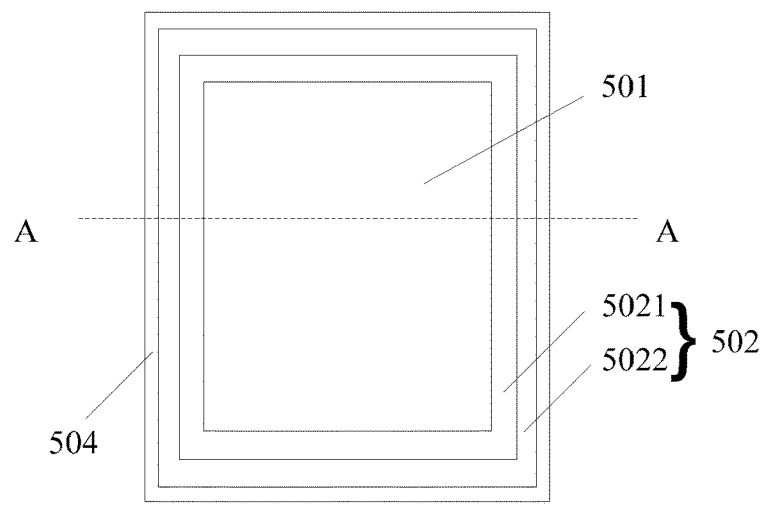
FIG. 5a is a top view structure diagram of an OLED device provided by another embodiment of the disclosure.
Figure 5B:
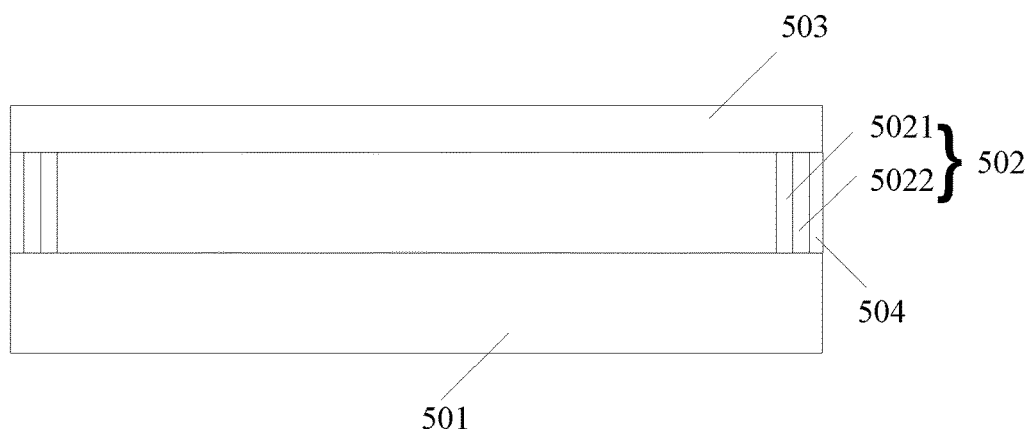

Referring to FIGS. 5a and 5b, an OLED device is further provided in another embodiment of the present disclosure. Compared with the structure provided in FIG. 4b (or FIG. 4a), the frame 502 provided in FIG. 5a and FIG. 5b is composed of an insulation frame 5021 and a conductive frame 5022. For example, the OLED device comprises: a substrate 501, a frame 502, a cover plate 503, and a metal thin film 504. The frame 502 is clamped between the substrate 501 and the cover plate 503. The metal thin film 504 is formed on a surface of the frame 502 close to the outside edge of the substrate 501. The frame 502 comprises: an insulation frame 5021 and the conductive frame 5022 composed of insulation material doped with conductive particles; the conductive frame 5022 is generally arranged at the periphery of the insulation frame 5021. The frame 502 is generally a barrel structure, the surface of the frame 502 close to the outside edge of the substrate 501 is a surface of the frame 502 exposed in the outside.

In an embodiment of the present disclosure, for example, the insulation material is UV cement. When the UV cement is used as an insulation material for fabricating the insulation frame 5021, the UV cement only needs to be coated on the array substrate to form a frame shape. The manufacturing process of the insulation frame 5021 can be easily implemented by using the existing equipments. Of course, the insulation material in the embodiment of the present disclosure is not limited to UV cement, for example, the insulation material can also be an insulation material such as silica. The insulation frame 5021 can also be made of the insulation material such as silicon dioxide.

In an embodiment of the present disclosure, the conductive particles comprise metal particles, metal wires, graphene or carbon nanotubes. Accordingly, the insulation material doped with conductive particles can be the UV cement added with metal particles, metal wires, graphite or carbon nanotubes. The manufacturing method of the conductive frame 5021 is similar to that of the insulation frame, it can be implemented by using the existing equipments, and detailed descriptions will be omitted herein.

In an embodiment of the present disclosure, the thickness of the insulation frame 5021 is 1 mm, and the thickness of the conductive frame 5022 is 1 mm. The insulation frame 5021 and the conductive frame 5022 set according to the above thicknesses, can not only ensure the sealing effect, but also ensure that the entire device will not be too heavy.

In an embodiment of the present disclosure, the mass percent of the conductive particles in the insulation material doped with conductive particles is from 5% to 20%, for example, the percent is 10%. By keeping the mass percent of the conductive particles in the insulation material doped with conductive particles in the above range, the conductive effect of the frame can be ensured, and the growing of the metal thin film can be achieved successfully.

In an embodiment of the present disclosure, the metal thin film for example can be a thin film of titanium (Ti), manganese (Mn), iron (Fe), tin (Sn), zinc (Zn), chromium (Cr), silver (Ag) or nickel (Ni), or an alloy thin film of at least two kinds of metal of titanium (Ti), manganese (Mn), iron (Fe), tin (Sn), zinc (Zn), chromium (Cr), silver (Ag) and nickel (Ni), to ensure the sealing effect of the metal thin film.

In an embodiment of the present disclosure, the thickness of the metal thin film for example can be 7 μm to 50 μm. By setting the metal thin film according to the above thickness, not only the sealing effect is ensured, but also the entire device is light.

In addition, the thickness of the metal film can be determined according to the metal materials actually used. For example, the thickness of the zinc (Zn) thin film can be from 7 μm to 50 μm, for example it may be set as 20 μm; the thickness of the tin (Sn) and nickel (Ni) thin film may be 10 μm to 20 μm, for example they may be set as 15 μm.

Figure 6A:
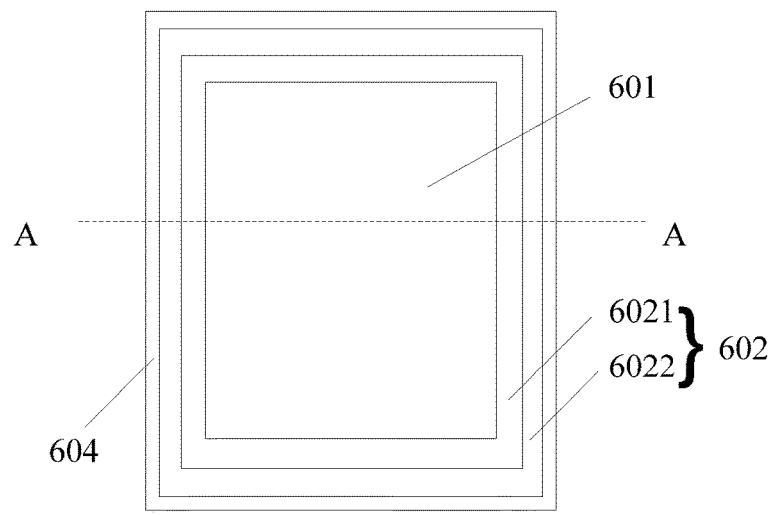
FIG. 6a is a top view structure diagram of an OLED device provided by another embodiment of the disclosure.
Figure 6B:
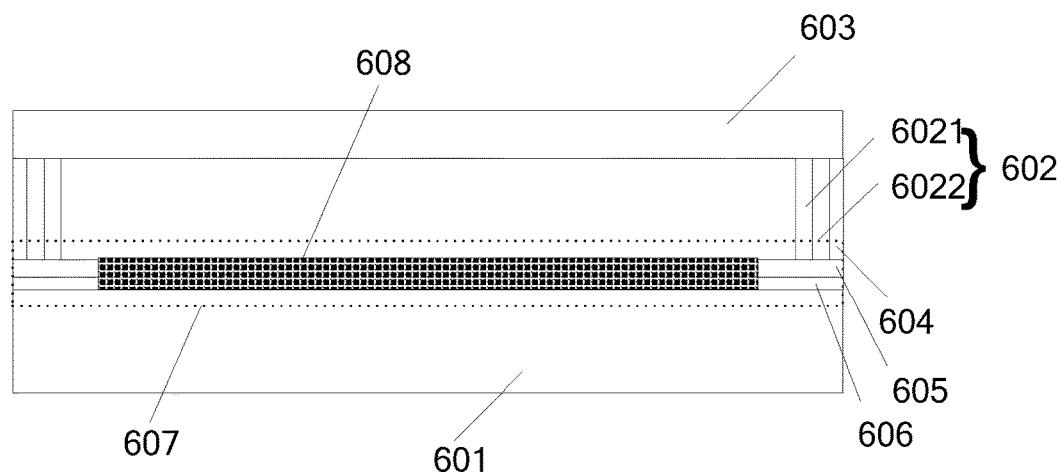

Referring to FIGS. 6a and 6b, an OLED device is further provided in another embodiment of the present disclosure, compared with the structure provided in FIG. 4b (or FIG. 4a) or FIG. 5b (or FIG. 5a), the frame 602 provided in FIG. 6a and FIG. 6b is composed of an insulation frame 6021 and a conductive frame 6022. For example, the OLED device comprises: a substrate 601, a frame 602, a cover plate 603, and a metal thin film 604, the frame 602 is clamped between the substrate 601 and the cover plate 603; the metal thin film 604 is formed on a surface of the frame 602 close to the outside edge of the substrate 601. The frame 602 comprises: an insulation frame 6021 and the conductive frame 6022 composed of insulation material doped with conductive particles, the conductive frame 6022 is generally arranged at the periphery of the insulation frame 6021; a display unit 607 is disposed on the substrate 601, the display unit 607 includes a display area 608 and a lead wire area 606, the frame 602 is arranged at the periphery of the display unit 607.

The OLED device further comprises: an insulation layer 605 arranged in the lead wire area, the insulation layer 605 is arranged between the lead wires 606 of the lead wire area and the frame 602. The frame 602 generally is a barrel structure, the surface of the frame 602 close to the outside edge of the substrate 601 is a surface exposed in the outside.

The shape of the insulation layer 605 can be set in any shape, but it is required to ensure that the lead 606 in the lead wire area can be covered by the insulation layer 605. The insulation layer 605 is to prevent short circuit generated by the metal thin film 604 disposed on the frame and the lead 606.

The above are only the model implementation ways of the present disclosure, and not used to limit the scope of protection of the present disclosure, the scope of protection of the present disclosure is determined by the attached claims.

The present application claims the priority of the Chinese Patent Application No. 201510386986.5 filed on Jun. 30, 2015, which is incorporated herein by reference as part of the disclosure of the present application.

What is claimed is:

1. An encapsulation method of an organic light-emitting diode (OLED), comprising:
   providing a substrate for encapsulation and a cover plate;
   forming a conductive frame on the substrate for encapsulation;
   cell assembling the substrate for encapsulation which is provided with the conductive frame and the cover plate to obtain a preforming device; and
   placing the preforming device into a plating tank, and energizing the frame, wherein a metal thin film is formed on a surface of the frame close to the outside edge of the substrate;
   the frame comprises an insulation frame and a conductive frame formed of an insulation material doped with conductive particles, and the conductive frame is arranged at a periphery of the insulation frame.

2. The method according to claim 1, wherein an insulation frame is formed on the substrate for encapsulation using an insulation material;
   the conductive frame is formed at a periphery of the insulation frame using an insulation material doped with conductive particles.

3. The method according to claim 2, wherein a thickness of the insulation frame is 1 mm, and a thickness of the conductive frame is 1 mm.

4. The method according to claim 2, wherein the insulation material is ultraviolet (UV) cement.

5. The method according to claim 2, wherein the conductive particles comprise metal particles, metal wires, graphene or carbon nanotubes.

6. The method according to claim 2, wherein a mass percent of the conductive particles in the insulation material doped with conductive particles is from 5% to 20%.

7. The method according to claim 1, wherein a display unit is formed on the substrate for encapsulation, the display unit comprises a display area and a lead wire area, the conductive frame is arranged at a periphery of the display unit, and the method further comprises:
   fabricating an insulation layer in the lead wire area, wherein the insulation layer is arranged between the conductive frame and lead wires of the lead wire area.

8. The method according to claim 1, wherein the metal thin film is a thin film of titanium (Ti), manganese (Mn), iron (Fe), tin (Sn), zinc (Zn), chromium (Cr), silver (Ag) or nickel (Ni), or an alloy thin film of at least two kinds of metal of titanium (Ti), manganese (Mn), iron (Fe), tin (Sn), zinc (Zn), chromium (Cr), silver (Ag) and nickel (Ni).

9. The method according to claim 1, wherein a thickness of the metal thin film is from 7 to 50 μm.

10. An organic light-emitting diode (OLED) device, comprising:

a substrate, a frame, a cover plate, and a metal thin film,
wherein the frame is clamped between the substrate and the cover plate, and the metal thin film is disposed on a surface close to an outside edge of the substrate of the frame;

the frame comprises an insulation frame and a conductive frame formed of an insulation material doped with conductive particles, and the conductive frame is arranged at a periphery of the insulation frame.

11. The OLED device according to claim 10, wherein a thickness of the insulation frame is 1 mm, and a thickness of the conductive frame is 1 mm.

12. The OLED device according to claim 10, wherein the insulation material is ultraviolet (UV) cement.

13. The OLED device according to claim 10, wherein the conductive particles comprise metal particles, metal wires, graphene or carbon nanotubes.

14. The OLED device according to claim 10, wherein a mass percent of the conductive particles in the insulation material doped with conductive particles is from 5% to 20%.

15. The OLED device according to claim 10, wherein a display unit is disposed on the substrate for encapsulation, the display unit comprises a display area and a lead wire area, the frame is arranged at a periphery of the display unit, and the OLED device further comprises:

an insulation layer disposed in the lead wire area, wherein the insulation layer is arranged between the frame and lead wires of the lead wire area.

16. The OLED device according to claim 10, wherein the metal thin film is a thin film of titanium (Ti), manganese (Mn), iron (Fe), tin (Sn), zinc (Zn), chromium (Cr), silver (Ag) or nickel (Ni), or an alloy thin film of at least two kinds of metal of titanium (Ti), manganese (Mn), iron (Fe), tin (Sn), zinc (Zn), chromium (Cr), silver (Ag) and nickel (Ni).

17. The OLED device according to claim 10, wherein a thickness of the metal thin film is from 7 to 50 µm.

18. The OLED device according to claim 10, wherein a display unit is disposed on the substrate for encapsulation, the display unit comprises a display area and a lead wire area, the frame is arranged at a periphery of the display unit, and the OLED device further comprises:

an insulation layer disposed in the lead wire area, wherein the insulation layer is arranged between the frame and lead wires of the lead wire area.

19. The OLED device according to claim 10, wherein the metal thin film is a thin film of titanium (Ti), manganese (Mn), iron (Fe), tin (Sn), zinc (Zn), chromium (Cr), silver (Ag) or nickel (Ni), or an alloy thin film of at least two kinds of metal of titanium (Ti), manganese (Mn), iron (Fe), tin (Sn), zinc (Zn), chromium (Cr), silver (Ag) and nickel (Ni).

* * * * *